United States Patent [19]

Hyatt

[11] 4,034,276

[45] July 5, 1977

[54] DIGITAL SIGNAL PROCESSOR FOR SERVO VELOCITY CONTROL

[76] Inventor: Gilbert P. Hyatt, P.O. Box 4584, Anaheim, Calif. 92803

[22] Filed: Mar. 9, 1973

[21] Appl. No.: 339,817

Related U.S. Application Data

[60] Division of Ser. No. 135,040, April 19, 1971, which is a continuation-in-part of Ser. No. 101,881, Dec. 28, 1970.

[52] U.S. Cl. .............................................. 318/608
[51] Int. Cl.² .......................................... G05B 1/02
[58] Field of Search .......... 318/603, 607, 608, 618, 318/314, 318; 307/262, 216; 328/109, 133

[56] References Cited

UNITED STATES PATENTS

| | | | |
|---|---|---|---|
| 3,386,021 | 5/1968 | Fischer | 318/314 UX |
| 3,462,663 | 8/1969 | Schiller | 318/607 |
| 3,478,178 | 11/1969 | Grace | 318/318 X |
| 3,514,679 | 5/1970 | Larsen | 318/314 |
| 3,519,904 | 7/1970 | Rogers | 318/603 X |
| 3,539,897 | 11/1970 | Sommeria | 318/618 |
| 3,546,553 | 12/1970 | Loyd | 318/318 |
| 3,564,368 | 2/1971 | Kelling | 318/314 |
| 3,588,659 | 6/1971 | Rogers | 318/608 |

*Primary Examiner*—James R. Scott
*Attorney, Agent, or Firm*—Gilbert P. Hyatt

[57] ABSTRACT

A digital signal processor is provided for processing analog signals with digital circuits. In a preferred embodiment, a servo feedback signal is processed with a digital arrangement to derive servo velocity information. Processing is performed by synchronizing a counter with a servo feedback signal and comparing the period of the feedback signal with a reference signal from the counter as being indicative of servo velocity.

19 Claims, 10 Drawing Figures

DIGITAL SIGNAL PROCESSOR FOR SERVO VELOCITY CONTROL

CROSS REFERENCE TO RELATED APPLICATIONS

This application is a divisional of copending application Control Apparatus Ser. No. 135,040 filed Apr. 19, 1971 by Gilbert P. Hyatt and which copending application is a continuation in part of application Factored Data Processing System for Dedicated Applications Ser. No. 101,881 filed on Dec. 28, 1970 by Gilbert P. Hyatt and which copending application is related to applications (1) Interactive Control System Ser. No. 101,449 now abandoned filed on Dec. 28, 1970 by Lee, Cole, Hirsch, Hyatt, and Wimmer and (2) Control System and Method Ser. No. 134, 958 filed on Apr. 19, 1972 by Gilbert P. Hyatt and which have been incorporated in said copending application by reference; wherein said applications Ser. Nos. 135,040, 101,881, 101,449, and 134, 958 are incorporated herein by reference as if fully set forth at length herein; wherein all of these applications are copending applications with the instant application; and wherein the benefits of the filing dates of all of these copending applications are claimed in accordance with 35 USC 120. su

BACKGROUND OF THE INVENTION

1. Field of the Invention

The present invention control apparatus generally relates to servo control systems and, more particularly, to those adapted for machine control systems. The term "machine" as employed herein broadly refers to any physical system performing work functions such as machine tools, process valves, optical devices, temperature regulators, motors, fluid controllers, etc. The term "machine element" refers to any element of such a "machine" . The term "numerical control" refers to the control by number commands as performed by electronic devices.

2. Prior Art

The automation of machine control has lead to increased efforts to provide an alternative to those systems described by the prior art. Conventional servo mechanisms are well known in the art as elements of systems used to position a machine or other device with an adequate degree of accuracy. Typically, a position sensitive device detects the position or movement of the machine or other apparatus being monitored. A feedback signal source provides a signal determined by the position sensitive device. The feedback signal is compared to the command signal to provide an error signal that is employed in the servo mechanism to alter the position of the machine until the feedback and command signals are equal. The conventional servo mechanism loop is based upon analog signal processing. Analog signal processing provides efficient but expensive hardware implementation to provide continuous control over a machine tool or other type of devices.

SUMMARY OF THE INVENTION

The present invention digital machine control apparatus substantially solves those problems existing in the devices disclosed by the prior art. The present invention utilizes digital technology while preserving the advantages of an anlog servo loop. The signals are continuous in nature thereby precluding the disadvantages of those hybrid systems requiring techniques which have poor resolution characteristics. The present invention utilizes digital techniques for determining the position and velocity of a machine, the processing of the positional and velocity information being performed in a digital manner. The present invention utilizes no digital to analog converters thereby precluding the problems arising out of the devices disclosed by the prior art. Since a digital computer is utilized to generate command information, the problems of resolution and speed are substantially overcome.

The present invention machine control apparatus generally relates to the control of machine elements and numerical control systems which must be positioned in accordance with predetermined commands. The present invention utilizes the processing speed and capability of a digital computer for generating a digital command format establishing the manner in which the machine element is to be positioned. The machine element position is detected through the use of a conventional position detection device such as an inductive resolver. The stator windings of the resolver receive the output of a digital excitation generator, the rotor of the resolver outputting a signal which fully defines the angular position and velocity of the resolver rotor. The feedback signal from the position detection device is compared with the digital command format being output by the digital computer. The comparison of the command signal and the feedback signal utilizes digital techniques whereby a binary switching device is used to identify the polarity of the machine element error. Additional logic is employed to produce a resultant error signal to be used to drive a conventional servo mechanism for repositioning the machine or machine element to comply with the existing digital command.

It is therefore an object of the present invention to provide a control system which utilizes digital technology.

It is another object of the present invention to provide improved methods and an apparatus for digital positioning.

It is still another object of the present invention to provide a control system for positioning machine tools which is simple and inexpensive to construct and reliable in operation.

The novel features which are believed to be characteristic of the invention, both as to its organization and method of operation, together with further objectives and advantages thereof will be better understood from the following description considered in connection with the accompanying drawing in which a presently preferred embodiment of the invention is illustrated by way of example. It is to be expressly understood, however, that the drawing is for the purpose of illustration and description only, and is not intended as a definition of the limits of the invention.

BRIEF DESCRIPTION OF THE DRAWINGS

FIG. 3b is a timing diagram of the excitation generator shown in FIG. 3a.

DESCRIPTION OF THE PRESENTLY PREFERRED EMBODIMENT

Figure 1:
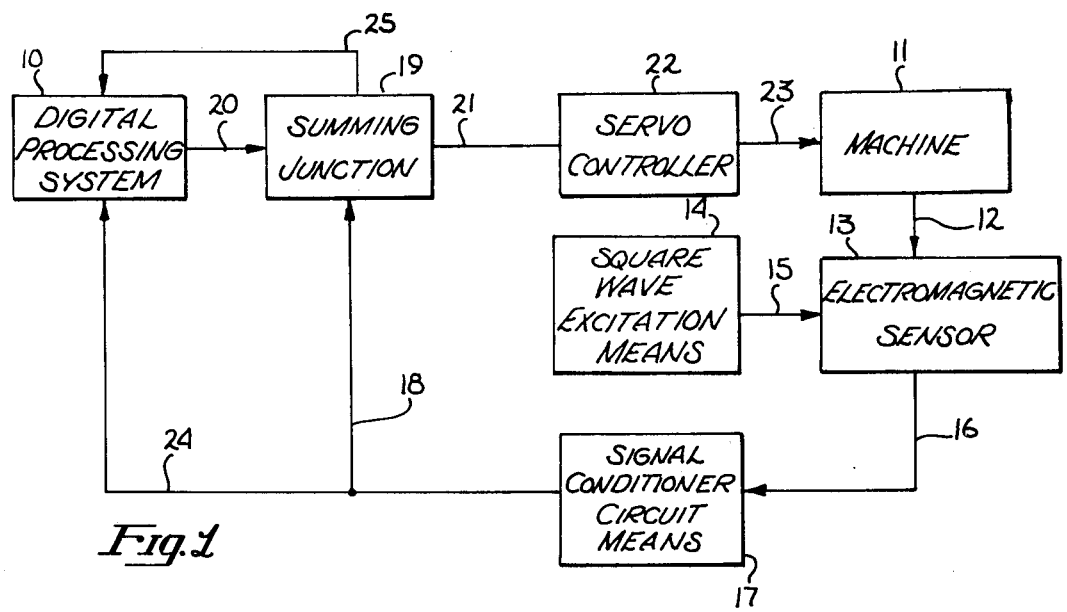
FIG. 1 is a schematic diagram, in block form, of the present invention digital machine control apparatus.

An understanding of the present invention machine control apparatus can be best understood by reference to FIG. 1 wherein a schematic diagram in block form of an embodiment of the present invention is shown therein. A digital processing system 10 is the source of real time path defining command signals to be directed to machine tool 11 such as described in the copending patent application; Ser. No 134,958; Control System and Method. Digital processing system 10 is typically a general purpose, stored program digital computer having the internal capability to store and process the required data needed to position machine 11. The manner in implementing digital processing system 10 is preferably a stored program, general purpose digital computer, but digital processing system 10 could be a wired program special purpose digital computer, such as described in the copending patent applications, such as Ser. No. 101,881 entitled Data Processing System.

Digital processing system 10 shall, by means of the stored program, maintain suitable position data for the movement of machine 11. Machine 11 is a conventional device or tool (e.g., drafting machine, flame cutter, lathe, grinder, etc.), which is suitable to be used in combination with machine control systems. The use of machine tool 11 is for the purpose of illustration and description only. Machine tool 11 provides positional output data 12 to position detector 13. Positional output data 12 is typically angular or longitudinal position data which is mechanically coupled to electromagnetic sensor 13 but positional output data 12 could be any parameter which is detectable by electromagnetic sensor 13. Electromagnetic sensor 13 is preferably an inductive resolver or synchro which is mechanically coupled to machine tool 11, but electromagnetic sensor 13 could be implemented through the use of other encoding techniques such as digital, optical or magnetic encoders. Square wave excitation means 14 provides electrical signals on line 15 to electromagnetic sensor 13 whereby electromagnetic sensor 13 will output an electrical signal which is a function of the output of square wave means 14 and positional output data 12, the output of electromagnetic sensor 13 appearing on line 16, the output thereof defining the positional parameter of machine tool 11 as detected by position detector 13. Signal conditioner circuit means 17 accepts the output signal of electromagnetic sensor 13 appearing on line 16 and conditions same for digital comparisons. Signal conditioner circuit means 17 can be conventional conditioning circuits, and it is preferably fabricated through the use of bandwidth limiting filters. The output of signal conditioner circuit means 17 appears on line 18, line 18 being a first input to summing junction 19. Summing junction 19 accepts as inputs thereto the output of signal conditioner circuit means 17 and the digital command signals from digital processing system 10 as it appears on line 20. The output of signal conditioner circuit means 17 is typically a signal which respresents the current angular or other positional state of machine tool 11 and, therefore, constitutes a feedback signal. Summing junction 19 compares the digital command from digital processing system 10 as it appears on line 20 and the feedback signal as it appears or line 18. The output of summing junction 19 appears on line 21 and constitutes the deviation between the commanded position for machine tool 11 and the current or actual position as represented by the feedback output signal of signal conditioner circuit means 17. The output of summing junction 19 can be positive or negative relative to the commanded signal. The output of summing junction 19 fully defines the magnitude of the deviation between the commanded and current position of machine tool 11 as well as the polarity of the correction to be imposed. The deviation signal as it appears on line 21 is input to servo controller 22 which applies mechanical correction forces to machine tool 11 by a mechanical coupling 23. The squarewave signals from signal conditioner control means 17 and summing junction 19 are also input to digital processing system 10 on lines 24 and 25 respectively as feedback signals to provide feedback information such as for adaptive control of machine tool 11.

The system illustrated in FIG. 1 is a closed loop machine control system which permits the imposition of command information upon machine tool 11 with the subsequent ability to utilize current positional information for updating or correcting the positional data output by machine tool 11 to comply with the substance of the imposed digital command. The system as illustrated in FIG. 1 consitutes a digital implementation for the machine control system. Square wave signals are output by square wave excitation means 14 for the generation of a digital signal which defines the angular or other pertinent positional parameter of machine tool 11. The digital signal which defines the position of machine tool 11 is summed at summing junction 19 and compared to the command position as output by digital processing system 10. The control loop is closed with the provision of conventional servo mechanism 22 whereby correctional information is imposed upon machine tool 11. The implementation of the present invention control apparatus maximizes the use of digital processing thereby taking advantage of such art as digital integrated circuits, superior response time of digital integrated circuits, reduced power dissipation and the inherent simplicity of design tolerances.

Although it is understood that the present invention interactive digital servo controller is preferably implemented in a manner which provides that the summing junction 19 (FIG. 1) receives the digital command signals and the feedback signal and processes these signals for control of the machine took, the present invention could be implemented in a manner which would integrally utilize the total processing capabilities of digital processing system 10 by connecting the output signal conditioner circuit means to digital processing system 10 by line 24. Since summing junction 19 produces an error or deviation signal wherein the pulse width is proportional to the deviation between the commanded and current position of the machine tool 11, that signal could be directly input to digital processing system 10 in line 24 for adaptive control of machine tool 11. The internal logic, hardware and programming systems operating within digital processing system 10 could be used to adaptively determine the prospective positioning for machine tool 11, digital processing system 10 issuing commands to servo controller 22 utilizing techniques presented in the co-pending application Control System and Method referred to herein.

Figure 2:
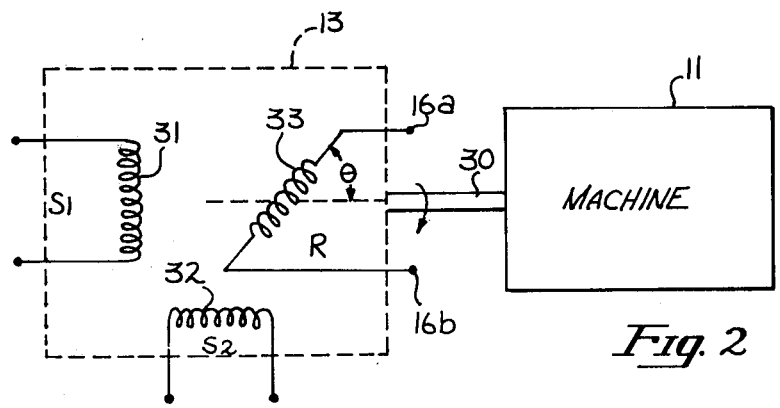
FIG. 2 is a schematic diagram, in partial block form, illustrating the coupling between an induction resolver and the machine in accordance with the present invention.

The ability to fully define the position and velocity of machine tool 11 through the use of digital processing is a novel element of the present invention digital machine control apparatus. Referring now to FIG. 2, a form of electromagnetic sensor 13 is shown therein, electromagnetic sensor 13 being implemented through the use of an inductive resolver. Machine tool 11 is mechanically coupled to resolver 13 by a mechanical coupling 30. Mechanical coupling 30 is illustrated for the purpose of example to represent angular displacement of a machine element of machine tool 11. Although resolver 13 is directly adapted to the measurement of angular displacement, it is understood that mechanical coupling 30 could be merely the angular representation of a predetermined linear displacement. Since resolver 13 measures angular displacement, the parameter of angular displacement will be used in the following discussion for the purpose of example. Resolver 13 is a conventional device typically used in alternating current circuits as an angular position transducer. Resolver 13 has at least two stator windings 31 and 32 and a rotor winding 33 which is located in the region of the magnetic field produced by stator windings 31 and 32. Stator windings 31 and 32 are mechanically arranged to provide magnetic fields which are at right angles to one another in space. It is understood that the structure of resolver 13 includes one wherein the stator and rotor windings each comprise two separate coils situated at right angles to each other. Typically, in the implementation having a pair of coils at right angles, quadrature alternating current signals are applied at the terminals of the stator windings, the output being found at the two orthogonal rotor windings. When the rotor windings are placed at an angle $\theta$ with respect to the stator windings, the output voltages at the rotor winding will be as follows:

$$e_{1r} = E \cos \theta$$
$$e_{2r} = E \cos \theta$$
$$e_r = E(\sin \theta + \cos \theta) \quad (1)$$

Where $E$ represents the magnitude of the alternating signal input to the stator winding $e_{1r}$ and $e_{2r}$ are the components of the output signal, and $e_r$ is the total output signal.

The implementation of resolver 13 as incorporated in an embodiment of the present invention may have the excitation of the pair of stator windings 31 and 32 by square wave excitation means 14, stator windings 31 and 32 being excited by a pair of electrical signals which are out of phase by 90° electrically. Where this state exists, the rotor will be in a rotating magnetic field of constant amplitude. The voltage induced in rotor 33 will be of constant amplitude and will have a phase which depends upon its angular position $\theta$ with respect to stators 31 and 32. Where alternating current signals are imposed upon stator windings 31 and 32, namely, $i_{s1} = I_o \sin \omega_t$ and $i_{s2} = -I_o \cos \omega_t$, and where the mutual inductances between the rotor and stator windings 31 and 32 are $M_{1r} = M \cos \theta$ and $M_{2r} = M \sin \theta$, the following equations represent the relationship between the output of rotor winding 33, stator windings 31 and 32 and the angular displacement $\theta$:

Where:

$e_{or}$ = output of rotor winding 33

$$e_{or} = M_{1r} \frac{di_{s1}}{dt} + M_{2r} \frac{di_{s2}}{dt} \qquad \text{equation (2)}$$

$$e_{or} = M\omega [\sin \theta \cos \omega t + \cos \theta \sin \omega t]$$
$$e_{or} = M\omega \sin(\theta + \omega t) \qquad \text{Eq. (2)}$$

The equation for the output signal from rotor 33 verifies the relationship between the rotor winding 33 and stator windings 31 and 32 whereby the input to stator windings 31 and 32 of alternating current signals differing in phase by 90° will convert a mechanical angle of rotation $\theta$ into an electrical phase angle.

The input to stator windings 31 and 32 in accordance with an embodiment of the present invention provides that the input signals are two square wave signals out of phase by 90°. It is well known that a square wave is merely the summation of all sine waves of odd harmonics and, therefore, the basic relationships between the angular rotation of mechanical coupling 30 and the excitation signals remains as set forth hereinabove. The output of rotor winding 33 is a complex signal having a polarity transition which fully defines the anular position of machine tool 11 as provided by mechanical coupling 30.

Figure 3A:
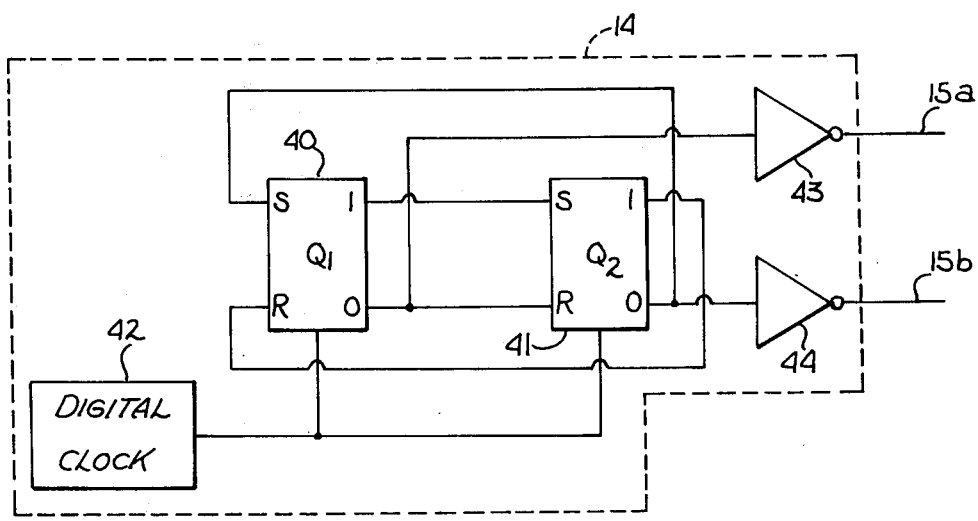
FIG. 3a is a logic circuit for implementing the excitation generator of FIG. 1.
Figure 3B:
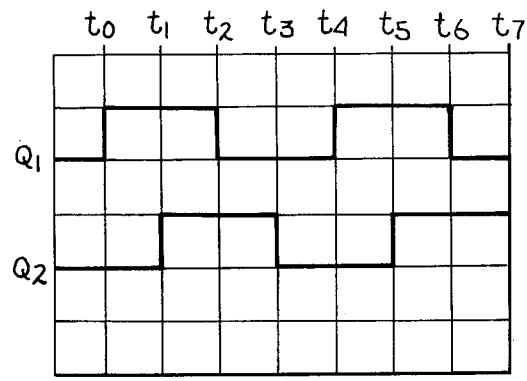

Referring now to FIG. 3a, a logical schematic diagram of square wave excitation means 14 is shown therein. As set forth hereinabove, the output of square wave excitation means 14 is a pair of digital signals differing in phase by 90°. Binary switching elements 40 and 41 are interconnected to provide the electrical signals having the characteristic set forth in FIG. 3b. Binary switching elements 40 and 41 are preferably digital flip-flop circuits, but they could be implemented through the use of other conventional binary switching elements. In order to provide the timing relationship set forth in FIG. 3b, typically referred to as quadrature square wave, the true output of flip-flop is connected to the set input of flip-flop 41, the false output of flip-flop 40 being connected to the reset input of flip-flop 41. In addition, the true output of flip-flop 41 is connected to the reset input of flip-flop 40 and the false output of flip-flop 41 is connected to the set input of flip-flop 40. In order to provide for orderly transitions of binary switching elements 40 and 41, digital clock 42 is connected to flip-flop 40 and 41. After providing for inversion and amplifications by inverters 43 and 44, the logical outputs of flip-flops 40 and 41 appear on lines 15a and 15b, respectively. The logical terms "true" and "false" are referred to in a conventional manner as is understood by persons skilled in the art, the logically true state being defined as the positive state of the signals as shown in FIG. 3b. It is undersood that the electrical circuit shown in FIG. 3a is a suitable one for the implementation of square wave excitation means 14, and that square wave excitation means 14 could be implemented by other circuits which would produce the timing signals shown in FIG. 3b.

Referring now to FIG. 3b, it can be seen that the output signals of the two logical elements have a combination of four output states, the comparable quadrants of the period of each signal being out of phase with the other by 90°. Since this is a quadrature relationship required by the equation set forth hereinabove, the output of rotor winding 33 will be an electrical signal which is a function of rotational angle $\theta$ and, therefore, fully defines the position of machine tool 11 as coupled to resolver 13 by mechanical coupling 30.

Figure 3C:
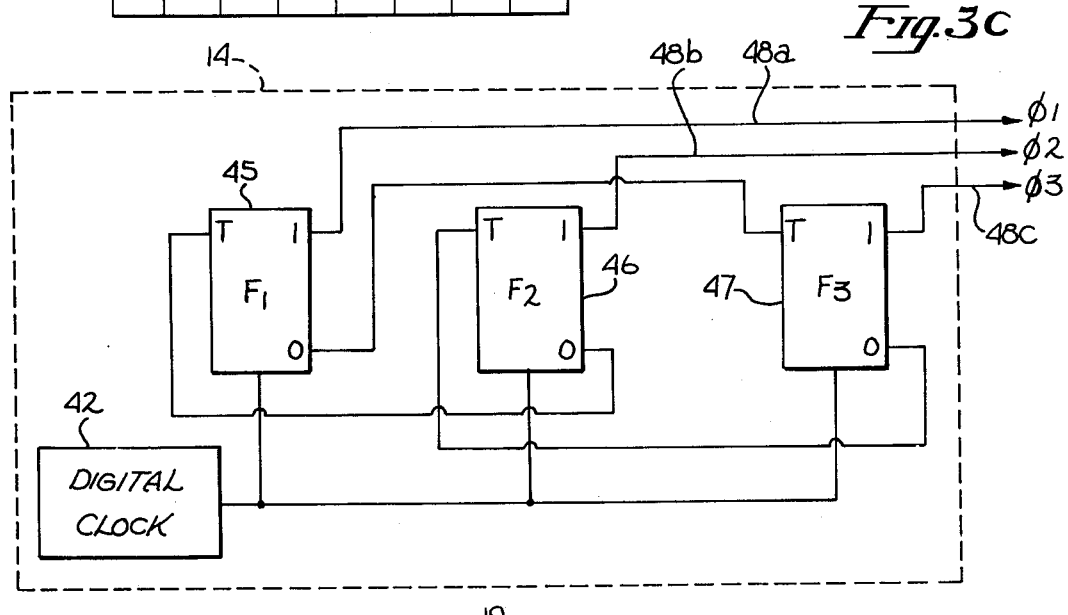
FIG. 3c is a logic circuit for implementing the excitation generator of FIG. 1 where a synchro is used as the electromagnetic sensor in accordance with the present invention.

Although the preferred implementation for position detector 13 utilizes an inductive resolver as shown in FIG. 2, electromagnetic sensor 13 could utilize a conventional synchro wherein three stator windings which are separated by 120° with respect to the adjacent stator windings could be utilized. Where a synchro is used to implement position detector 13, three binary switching devices are interconnected to provide three digital signals having proper phase orientation. A schematic of square wave excitation means 14 used with a synchro implementation of position detector 13 is shown in FIG. 3c. Flip-Flops 45, 46 and 47 are interconnected as shown in FIG. 3c, clock 42 being connected to each binary switching device as shown. The three output signals $\phi1$, $\phi2$ and $\phi3$ appear on lines 48a, 48b and 48c respectively and are represented as set out below as synchro excitation signals $e_{S1}$, $e_{S2}$, and $c_{S3}$ respectively. Where a synchro is employed, the sine wave analogies for the square wave input signals to the three stator windings are as follows:

$$e_{s1} = E \sin \omega t$$

$$e_{s2} = E \sin (\omega t + 120°)$$

$$e_{s3} = E \sin (\omega t + 240°) \quad \text{Equation (3)}$$

The output of the rotor windings will fully define the angular position of machine tool 11. Where $\theta$ represents the angular rotation of the rotor winding, the output of the synchro is a function of the digital excitation signals and of the angle $\theta$ and is represented as follows:

$$e_{or} = f[\cos(\omega t - \theta)] \quad \text{Equation (4)}$$

As in the case with an inductive resolver, the equation representing the output of the synchro rotor winding verifies the relationship between the stator windings, rotor windings, and the angular displacement of the rotor winding, namely, a mechanical cycle of rotation $\theta$ will be converted into an electrical phase angle.

As mentioned hereinabove, the output of inductive resolver 13 is a complex electrical signal which has an amplitude polarity transition which defines the angular position of mechanical coupling 30 and, therefore, of the machine element of machine tool 11. In order to utilize proper processing of the output of inductive resolver 13 as it appeared on line 16a and 16b, signal conditioner circuit means 17 receives the electrical signal appearing on line 16 filtering same to exclude the higher harmonics limiting the filtered signal to a suitable frequency range. The resulting filtered signal is restored to its binary state with squaring circuits, thereby providing a signal which can be digitally processed. The filters and squaring circuits are conventional devices known to those having skill in the art, the specific implementation thereof not being part of the present invention.

In order to determine whether or not machine tool 11 has reached a position consistent with that commanded by digital processing system 10, summing junction 19 compares the digital command signals output from digital processing system 10 with the feedback signal output by electromagnetic sensor 13 and connected to summing junction 19 by signal conditioner circuit means 17 (FIG. 1).

Figure 4A:
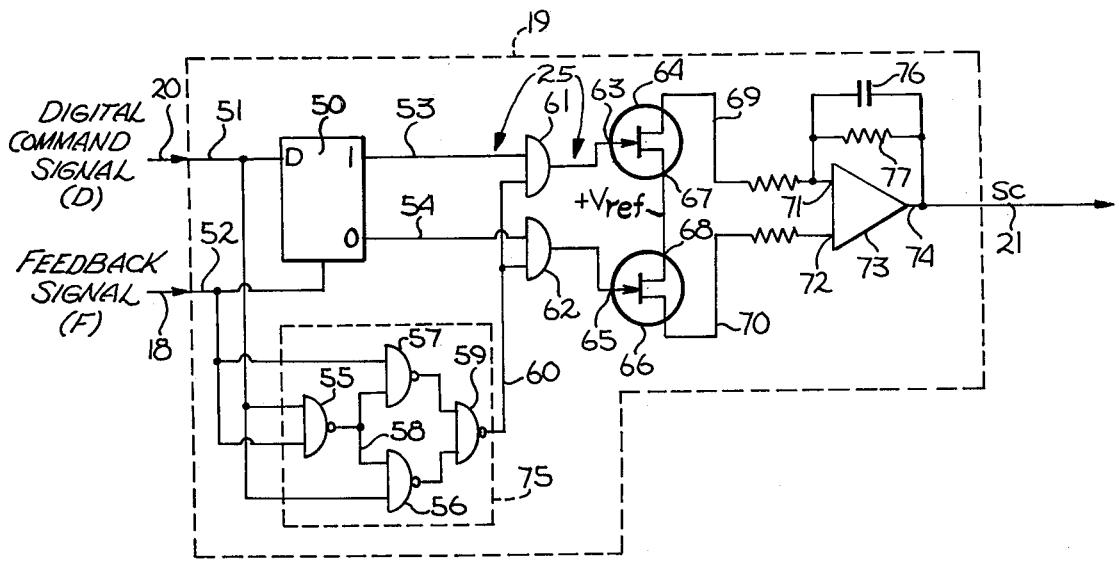
FIG. 4a is a schematic diagram of the digital summing junction circuit shown in FIG. 1 in accordance with the present invention.

Referring now to FIG. 4a, a schematic diagram of a suitable circuit for implementing summing junction 19 is shown therein. Binary switching device 50 receives the square wave command signal output from digital processing system 10 on D line 51 and the feedback signal output from signal conditioner circuit means 17 on clocking-line 52. Binary switching device 50 is preferably an electronic D type flip-flop circuit but it could be any suitable circuit capable of providing binary output signals. The true output of flip-flop 50 appears on line 53 and is designated at flip-flop 50 by the logical state 1. The false state of flip-flop 50 appears on line 54 and is designated at flip-flop 50 by the logical state 0. The digital command signal and the feedback signal are also connected to a logical circuit connected to perform a conventional exclusive-or function, the exclusive-or circuit being generally designated by the reference numeral 75. The digital command signal connected to D input line 51 is connected to NAND gates 55 and 56 and the feedback signal connected to clock-line 52 is connected to NAND gates 55 and 57. The output of NAND gate 55 is the inverted state of the logical AND function and is connected to the input of NAND gates 56 and 57 on line 58. The outputs of NAND gates 56 and 57 are input to NAND gate 59, with the output of NAND gate 59 being the logical exclusive-or function operating upon the digital command signal and the feedback signal and appearing on line 60. Line 60 is connected to the inputs of AND gates 61 and 62 with true-line 53 of flip-flop 50 being connected to AND gate 61 and false-line 54 of flip-flop 50 being connected to AND gate 62. The output signals from gates 61 and 62 constitute ternary type signals, where the signal from gate 61 is a negative direction command to excite the negative input 71 of amplifier 73 and the signal from gate 62 is a positive direction command to excite the positive input 72 of amplifier 73. Transistors 64 and 66 constitute analog switches controlled by the outputs of gates 61 and 62 respectively to provide precise amplitude signals to amplifier 73. The signals applied to the positive input 72 and negative input 71 of amplifier 73 provides a bipolar control signal 21. The circuits that are responsive to the signals from gates 61 and 62 to provide the signal 21 are shown in simplified functional form to better illustrate the operation of an embodiment of this invention. Detailed circuit arrangements will become obvious to those skilled in the art. The output of AND gate 61 is connected to gate 63 of field effect transistor 64. The output of AND gate 62 is connected to gate 65 of field effect transistor 66. The excitation contacts 67 and 68 of field effect transistors 64 and 66 respectively are connected to a common reference voltage designated as $V_{ref}$. Output contacts 69 and 70 of field effect transistors 64 and 66 respectively are connected to inputs 71 and 72 of operational amplifier 73 through input resistors. The output of operational amplifier 73 appears on line 74 and is used to drive servo controller 22 (FIG. 1). Operational amplifier 73 is one utilizing negative feedback and having relatively high input impedance.

Summing junction 19 accepts the digital phase related feedback signal output from signal conditioner circuit means 17 and compares it with the phase related command signal output of digital processing system 10. The information is contained within the polarity transitions of the respective digital signals. Summing junction 19 compares the time relationship of the digital command and the feedback signal and generates an error signal when the time relationship between the two signals displays a deviation. The width of the error signal for each half-cycle is proportional to the magnitude of the deviation between the digital command signal and the feedback signal. The polarity of the proportional error signal is determined by the state of flip-flop 50 at the time this error occurs to switch the error signal 60 into the positive input 72 or the negative input 71 of amplifier 73, thereby permitting the implementation of a bi-directional proportional servo controller implemented through digital techniques.

The digital command signal appearing on line 20 is connected to D input 51 as well as to the exclusive or circuit generally designated by the reference numeral 75. The feedback signal appearing on line 18 is connected to clock-input 52 as well as to exclusive-or circuit 75. Since the error signal at the output of summing junction 19 can be positive or negative based upon the deviation, if any, between a commanded, desired position as represented by the digital command signal and the current position of machine tool 11 as represented by the feedback signal, flip-flop 50 identifies the polarity of the deviation. Flip-flop 50 is a conventional D-type flip-flop circuit wherein its logical state will be switched to the state input to the D line 51 when there is a transition on clock line 52 from false to true. The occurrence of the transition of the feedback signal can either lead or lag the transition of the digital command signal. The occurrence of a leading or lagging feedback signal can be identified as positive or negative error, respectively.

Figure 4B:
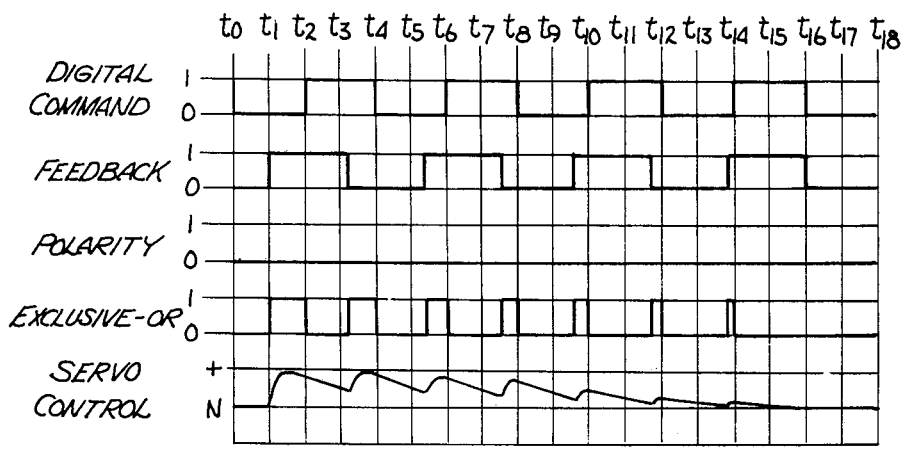
FIG. 4b and FIG. 4c are exemplary timing diagrams for the form of the summing junction circuit of FIG. 4a illustrating a leading and lagging error condition.
Figure 4C:
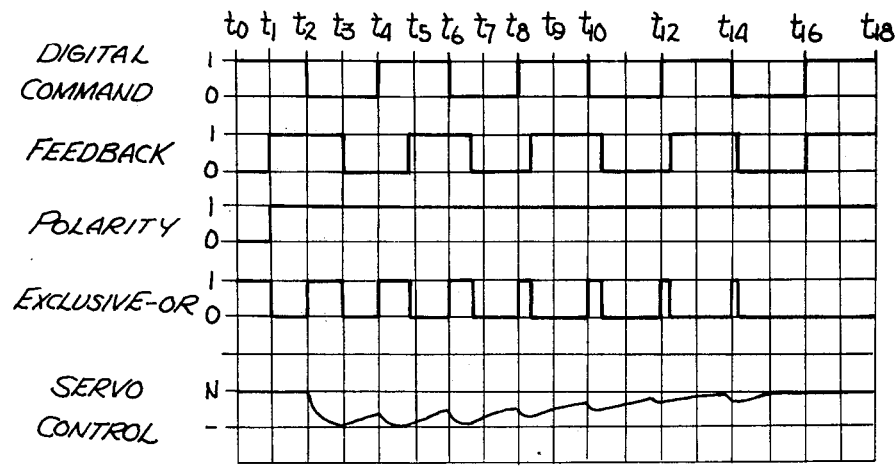

Referring now to FIG. 4b and FIG. 4c, timing diagrams for digital summing junction 19 are set forth for a leading and lagging feedback signal respectively. Referring first to FIG. 4b, a typical digital command signal is seen to be a symmetrical square wave having equal periods. The feedback signal is seen to be a square wave having a positive transition which precedes the positive transition of the digital command signal. At time $t_1$ the feedback signal makes a positive transition while the digital command signal does not have a positive transition until $t_2$. It is assumed that polarity flip-flop 50 has been initially set to the reset or false state for the purposes of example only. Since polarity flip-flop 50 will not switch from the false to the true state unless D line 51 is in the true state when there is a positive transition on clock-line 52, reference to FIG. 4b shows that polarity flip-flop 50 will remain in the false state throughout the timing sequence accompanying the existence of a leading feedback signal.

The output of exclusive-or circuit 75 will be a positive going signal when either the digital command signal or the feedback signal are in the true state, but exclusive of that period when both signals are in the true state or when both signals are in the false state. In FIG. 4b, it can be seen that the first true condition for the output of exclusive-or circuit 75 occurred between times $t_1$ and $t_2$ with the signal going to the zero or false state at time $t_2$. Since polarity flip-flop 50 is in the false state, the false output of polarity flip-flop 50 appearing on false line 54 will be in the high or enabling state, therefore, AND gate 62 will be enabled and AND gate 61 will be disabled. With AND gate 62 enabled, the true state of the output of exclusive-or circuit 75 will be output by AND gate 62 and appear at gate 65 of field effect transistor 66. The application of positive pulses at gate 65 of field effect transistor 66 will result in the occurrence of positive going signals at the output of operational amplifier 73. Where a pulse input appears, the output of operational amplifier 73 as it appears on output line 74 will decay consistent with the RC time constant imposed by the filter herein described (i.e., feedback capacitor 76 and resistor 77).

Referring again to FIG. 4b, it can be seen that the servo control signal as it appears on line 21 is the positive going signal that will begin to decay upon the termination of the deviation signal. Since the servo control signal will be applied to servo controller 22 which will in turn apply a correctional force to machine tool 11 to cause same to approach the position directed by digital processing systems 10, the transitions of the feedback signal should commence to approach the digital command signals. As can be seen at time $t_4$ in FIG. 4b, the negative going transition of the digital command signal is lead by the negative going transition of the feedback signal, but the degree of lead time has decreased from that exhibited within the period of $t_1$ through $t_2$. The effect of the decreased lead time results in the decreased pulse width of the output of exclusive-or circuit 75 as can be seen between the timing period $t_3 - t_4$. The resulting servo control signal as pictorially represented in FIG. 4b is one which will decay to a relatively lower value than that which occurred following the first correction signal. The next pertinent transition of digital command signals appeared at time $t_6$ of FIG. 4b. It can be seen that the leading feedback signal illustrates a positive going transition intermediate $t_5$ and $t_6$, the lead time between the feedback signal and digital command signal being reduced commensurate with the decreased deviation between the commanded position and the current position of machine tool 11. Since the pulse width is proportional to the magnitude of the error, the magnitude of the servo control signal and, therefore, the applied correction decreases until the deviation is substantially zero. In FIG. 4b, the transitions of the feedback signal and the digital command signal occur at substantially the same time as represented at time $t_{16}$. At $t_n$ because of the substantially simultaneous transition of the feedback signal and the digital command signal, the error signal is zero and, therefore, the servo control signal is at a null condition.

Referring to FIG. 4c, timing diagrams are illustrated representing the occurrence of a feedback signal which lags the digital command signal thereby resulting in a deviation which has been arbitrarily designated as negative error. Referring again to FIG. 4a, flip-flop 50 will switch from the false to the true state where D line 51 is in the true state when there is a positive transition on clock-line 52, i.e. feedback signal has a positive going transition. Referring to FIG. 4c, a time $t_1$ the digital command signal is in the true state and the feedback signal has a positive going transition. As a result, polarity flip-flop 50 switches from the false to the true state at this time. With the output of flip-flop 50 being in the true state, the true state appearing on line 53, AND gate 61 will be enabled and AND gate 62 will be disabled.

The input of the digital command signal and the feedback signal to exclusive-or circuit 75 will result in an output signal from exclusive-or circuit 75 which is positive when the digital command signal or the feedback signal is in the true state, but exclusive of those periods when both signals are in the true state or those periods when both signals are in the false state. Referring to FIG. 4c, it can be seen that following the switch of polarity flip-flop 50 from the false to the true state, the first positive going transition of the exclusive-or circuit 75 appears at a time $t_2$. Since AND gate 61 is enabled, the positive going pulse will be applied to the gate contact 63 of field effect transistor 64, the output contact 69 being connected to operational amplifier 73. The servo control signal appearing on output line 74 of operational amplifier 73 is a negative going signal which, after reaching its maximum value, will decay with an RC time constant of the filter equal to the product of feedback capacitor and resistor 76 and 77 respectively. Since the servo control signal shown in FIG. 4c will be applied to servo controller 22, which in turn will apply a correctional force to the machine tool 11, the feedback signal will illustrate a commensurate reduction in the deviation between the commanded and current position of the machine tool 11. As can be seen in the interval between time $t_4$ and $t_5$ of FIG. 4c, the lagging transition between the feedback signal and the digital commmand signal has decreased. The decrease in the deviation error results in a decreased pulse width of the output of exclusive-or circuit 75 with a commensurate reduction in the magnitude of the servo control signal. The succeeding time intervals as shown in FIG. 4c show consistent reductions in the lag time between the feedback signal and the digital command signal thereby producing error signals which illustate a decreasing pulse width and, therefore, a decreasing error signal. At time $t_{16}$ of FIG. 4c, the deviation between the feedback signal and the digital command signal is substantially zero, thereby producing the null condition of the servo control signal. It is understood that the logic circuit illustrated in FIG. 4a is a preferable form for digital summing junction 19, but digital summing junction 19 could be implemented by any suitable circuit.

Figure 5:
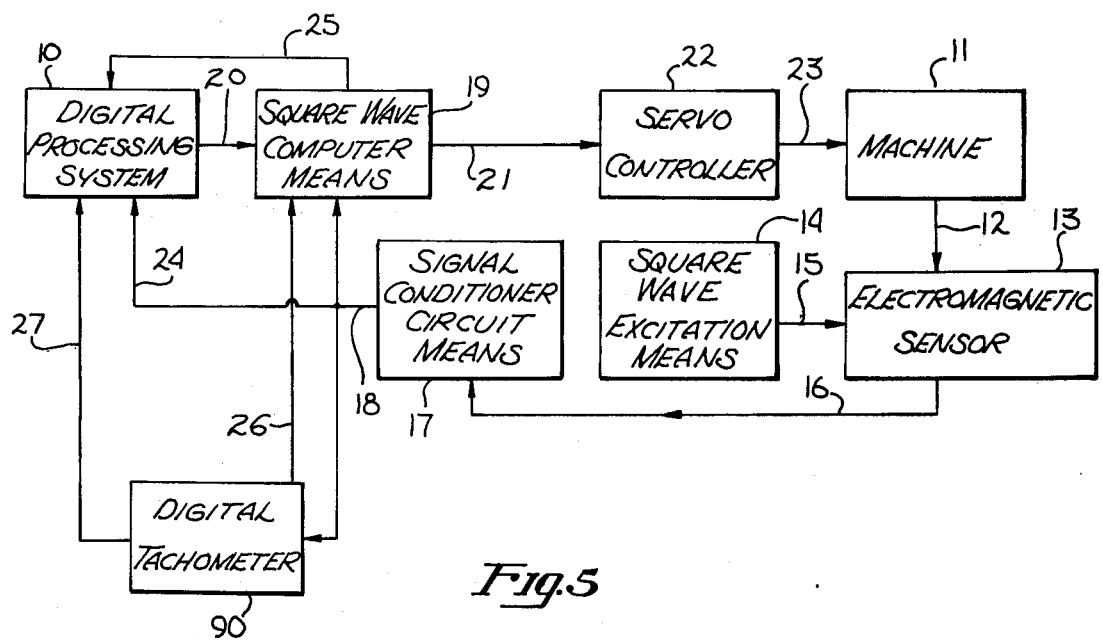
FIG. 5 is a schematic diagram, in block form, of the present invention control apparatus employing a digital tachometer.

Referring now to FIG. 5, a block diagram of another form of the present invention control apparatus is shown therein. The block diagram illustrated in FIG. 5 is similar to that shown in FIG. 1 with the exception that a digital tachometer is included for further refinement of the control over machine tool 11, the digital tachometer being generally designated by the reference numeral 90. For the sake of clarity, like elements bear the same reference numerals as are used in other figures. Digital tachometer 90 is utilized to provide velocity feedback data for compensation and stabilization of the present invention control apparatus as for other purposes. Analog compensation devices for servo stabilization are well known in the art and include the well known mechanical tachometer, analog lead networks, and analog lag networks; which are described in detail in AUTOMATIC CONTROL SYSTEMS by Benjamin C. Kuo published by Prentice Hall in 1962, particularly in Chapter 9 entitled Compensation of Feedback Control Systems on pages 300-359; incorporated herein by reference. The output of signal conditioner circuit means 17 is input to digital tachometer 90, summing junction 19 and digital processing systems 10 on lins 18 and 24. Digital tachometer 90 generates a signal proportional to velocity, the signal being summed with the error signal developed at summing junction 19. The output signal of digital tachometer 90 appears on lines 26 and 27 and is input to digital processing system 10 as well as summed with the deviation signal at the summing junction 19 such as at inputs 71 and 72 of amplifier 73 (FIG. 4a) to provide negative velocity feedback for stabilization.

The description of the cooperating relationship between square wave excitation means 14 and electromagnetic sensor means 13 as it pertains to FIG. 2 is equally applicable to the form of the present invention shown in FIG. 5. Where electromagnetic sensor means 33 is an inductive resolver as shown in FIG. 2, excitation of stator windings 31 and 32 by square wave excitation means 14 will result in an induced voltage at rotor 33 which has a phase relationship dependent upon the angular relationship $\theta$ between stators 31 and 32 and rotor 33. The output signal of rotor 33 is represented by that shown in equation (2), the signal exhibiting polarity transitions which define the angular position of machine tool 11.

As rotor 13 is rotated, the time between polarity transitions of the output signals is increased or decreased as a function of the angular velocity of the rotor 33. As a result, the angular velocity of rotor 33 and, therefore, of the appropriate element of machine tool 11 can be defined by measuring the period between polarity transitions of the induced output signal from rotor 33.

Figure 6:
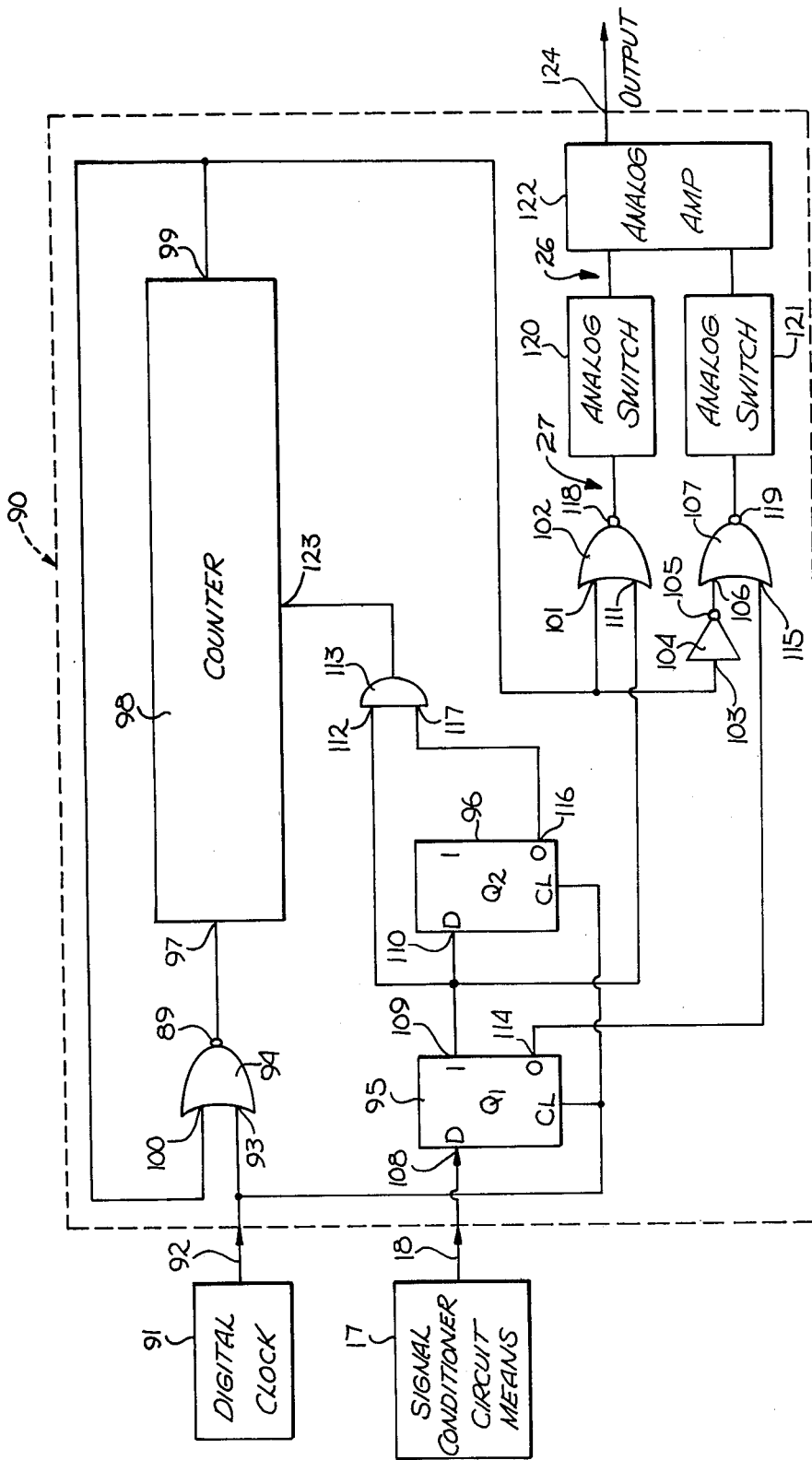
FIG. 6 is a logic circuit of a form of the digital tachometer of FIG. 5 in accordance with the present invention.

A form of a suitable circuit for implementing digital tachometer 90 is shown in FIG. 6. The output signal of digital clock 91 .s input to digital tachometer 90 on line 92, the output of digital clock 91 being connected to input 93 of NOR gate 94 and to the clock inputs of flip-flops 95 and 96. Output 89 of NOR gate 94 is connected to input 97 of counter 98. Output 99 of counter 98 is connected to input 100 of NOR gate 94, input 101 of NOR gate 102 and input 103 of inverter 104. Output 105 of inverter 104 is connected to input 106 of NOR gate 107. The processed output of electromagnetic sensor means 13 is input to digital tachometer 90 on line 18 and connected to D input 108 of flip-flop 95. True output 109 of flip-flop 95 is connected to D input 110 of flip-flop 96, input 111 of NOR gate 102 and input 112 of AND gate 113. False output 114 of flip-flop 95 is connected to input 115 of NOR gate 107 and false output 116 of flip-flop 96 is connected to input 117 of AND gate 113. Outputs 118 and 119 of NOR gates 102 and 107 respectively are input to analog switches 120 and 121 respectively, the output signals thereof being input to analog amplifier 122. Analog switches 120 and 121 and analog amplifier 123 operate in a manner similar to that described with regard to field effect transistors 64 and 66 and operational amplifier 73 (FIG. 4a). Output 124 of analog amplifier 122 connects digital tachometer 90 to the remainder of the form of the present invention control apparatus, such as by summing with signal 21 (FIGS. 1 and 5). As an alternate embodiment, the amplifier 73 (FIG. 4a) can be used in place of amplifier 122 (FIG. 6) with the output signals of analog switches 120 and 121 (FIG. 6) being input to analog inputs 71 or 72 or both of an amplifier 73 (FIG. 4a). Also feedback signal 27 (FIG.

5) could be squarewave signals from gates 102 and 107 (FIG. 6). The output of AND gate 113 is connected to counter-reset 123. The logical elements illustrated in FIG. 6 are conventional digital, logic elements such as Texas Instruments series 7400 integrated circuits understood by persons having skill in the art to which the present invention control apparatus pertains.

As was described hereinabove, the output signal from electromagnetic sensor means 13, preferably an inductive resolver, exhibits components which are the sum and difference of the excitations signals and the angular velocity of rotor 33 (FIG. 2). Where the angular velocity of rotor 33 is zero, the period of the output signal of resolver 13 will be equal to that of the excitation signals. Counter 98 (FIG. 6) defines the interval between waveform transitions associated with the excitation signals for a zero velocity time interval. This zero velocity interval constitutes the reference for digital tachometer 90, the reference signal being compared with the feedback signal from resolver 13 with NOR gates 102 and 107, the difference therebetween being a function of the magnitude and polarity of the angular velocity of rotor 33 and, therefore, machine tool 11.

In order to permit the measurement of angular velocity, the reference value for zero velocity must be synchronized with a polarity transition of the feedback signal derived from resolver 13. Referring now to FIG. 6, the operation of digital tachometer 90 can be best understood. Counter 98 comprises a conventional counter which registers a number of events at input 97, outputting an overflow signal at output 99 upon reaching a value which is consistent with the frequency of the events, i.e., frequency of digital clock 91 and the capacity of counter 98. Although the value is one of choice, where the output of digital clock 91 is a 2 Megahertz square-wave signal and where counter 98 is a 12-bit counter, a count of 2,048 will cause the most significant counter stage to be one set yielding a count interval between initiation and overflow which closely aproximates that generated by square-wve excitation means 14 (FIG. 5). Although counter 98 is shown to be a single unit, it is understood that the capacity of counter 98 could be implemented through appropriately connected counter-stages, e.g., three 4-bit counters.

In order to synchronize the zero velocity interval with the output of resolver 13, counter 98 is permitted to attain digital member count where the most significent bit is in the true state. Since output 99 of counter 98 will be false until an overflow into the most significant bit occurs, NOR gate 94 will enable the transfer of digital clock 91 output signals transferring same to input 97 of counter 98. Upon reaching the predetermined overflow digital number count condition, output 99 of counter 98 will switch to a true state thereby disabling NOR gate 94 and halting the counting operation of counter 98. When the output signal of resolver 13 makes a positive polarity transition, both flip-flops 95 and 96 will be in the false state as D input 108 of flip-flop 95 will go to the true state. Flip-flop 95 will be set to the true state on the next clock pulse thereby identifying the start of the positive half-cycle of the feedback signal derived from resolver 13 and synchronized with the clock signal 92. AND gate 113 is enabled, initiating or initializing the operation of counter 98 by resetting the disabling output 99 with clear signal 123, thereby enabling NOR gate 94 with input 100. Flip-flops 95 and 96 together with gate 113 form a synchronized square wave positive transition detector. When the output of the resolver 13 is in the false state, this false condition is clocked into flip-flops 95 and 96. When the output of resolver 13 makes a transition to the true state, D input 108 of flip-flop 95 will sense this true condition, but output 109 of flip-flop 95 will remain false until the clock 92 sets the output 109 of flip-flop 95 to this input true condition. The same clock 92 will set the flip-flop 96 to the 110 input condition which is the false 109 output condition of the flip-flop 95 before it has changed state. Immediately prior to the next clock pulse from clock 92, output 109 of flip-flop 95 will have been stabilized in the true state which also appears at the input 110 of the flip-flop 96, input 108 to the flip-flop 95 remains in the true state, AND gate 113 detects the true condition of flip-flop 95 as signal 112 and the false condition of flip-flop 96 as signal 117, and gate 113 generates the feedback squarewave positive transition command signal 123 to clear counter 98 and initiate the count. The next clock pulse from clock 92 sets flip-flops 95 and 96 to the true condition disabling the signal 123 thru gate 113. Counter 98 will commence to count digital clock 91 output pulses incrementing the digital number in counter 98 to provide a digital number related to the synchronized period duration or velocity until output 99 switches to a true state again disabling NOR gate 94. The counting time of counter 98, following initiation by the AND gate 113, constitutes the reference zero velocity interval. Since the counting interval was initiated by the polarity transition of the feedback signal, the count interval is precisely synchronized with the selected half-cycle period of the feedback signal.

The magnitude and polarity of the velocity parameter is determined by the frequency shift of the feedback squarewave, where the period of positive half-cycle signal 111 of the feedback squarewave is compared to the reference period signal 99 of counter 98. NOR gates 102 and 107 detect if one of these period signals terminates before the other period signal to define a velocity condition as a period difference related to a frequency difference of the feedback signal. For a positive velocity component, the feedback signal output from resolver 13 will have a negative polarity transition before output 99 of counter 98 disables NOR gate 94. When this occurs, NOR gate 102 will have a pulse output equal in width to the difference between the positive half-cycle of the feedback signal and the counting interval of counter 98. For a negative velocity component, the feedback signal output from resolver 13 will have a negative polarity transition after output 99 of counter 98 disables NOR gate 94. The combination of gating false output 114 of flip-flop 95 and inverted output 105 of counter 98 will result in a pulse output 119 from NOR gate 107 which is equal in width to the difference between the positive half-period of the feedback signal and the counting interval of counter 98. Although the positive going transition of the feedback signal output from resolver 13 is preferably used to initiate the velocity measurement, it is understood that other suitable logical criteria are embraced within the technique described.

Output 118 and 119 of NOR gates 102 and 107 respectively represent ternary digital signals which contain the information necessary to determine the magnitude and polarity of the angular velocity, if any, sensed by resolver 13. The ternary output signals are connected to conventional analog switches 120 and 121, the output thereof being a bi-polar proportional analog voltage. The output from analog switches 120 and 121 is combined with the output of summing junction 19 (FIG. 5), the composite signal stabilizing the operation of servo controller 22.

Two servo loops are illustrated in FIG. 1 where position feedback 18 to the summing junction 19 constitutes an inner control loop and where position feedback 24 to the computer in the digital processing system 10 constitutes an outer command loop. The inner control loop insures that the machine 11 is positioned as commanded and the outer command loop permits generation of the commands 20 in an adaptive manner and provides computer cognizance of servo operation. The combination of a computer and a squarewave servo have been found to have particular advantages. These include the simplicity of interfacing a computer to a squarewave servo as described in the parent application and in the referenced application Control System and Method. Squarewave signals are herein intended to mean any signals where the information is contained in a time related occurrance such as a transition from a positive to a negative state or zero crossing of that signal.

One example of the adaptive control previously discussed is to adjust the squarewave commands 20 from the computer 10 to maintain the position error 21 within a required tolerance. This would be achieved by the computer in the digital processing system 10 sensing the position error signal 21 as feedback signal 25, processing command information in response to the feedback information, then providing the squarewave command signals 20 to maintain the position error signal 21 within the required tolerance.

The computer in the digital processing system 10 can sense the feedback squarewave signals 18, 20, 53, 54, 60 (FIG. 4a) and signals 99, 109, 114, 118, 119 (FIG. 6) and others with instructions such as a skip on discrete instruction and can generate squarewave signals 20, 60, 63, 65, and others with instructions such as a discrete output instruction as disclosed in detail in the parent application.

The present invention digital machine control apparatus provides an apparatus whereby the processing capability of digital processing system 10 can be used to supply a continuous output of digital control commands, the information contained therein dictating the desired and, therefore, the commanded position for machine tool 11. It is understood that the present invention is adapted to be included within a numerical control system. The positioning information of machine tool 11 is extracted and processed by inductive resolver 13 in conjunction with the output of square wave excitation means 14. The processing of a single electronic signal which fully defines the angular or other pertinent position of machine tool 11 permits the digital processing of the feedback information relative to the commanded information. Summing junction 19 fully obviates the need for analog or hybrid systems, thereby permitting the implementation of a machine control system which uses techniques common to digital equipment but preserving the analog nature of such systems. By permitting the use of digital techniques to implement a machine control system, the circuit elements required for the present invention digital machine control apparatus can utilize LSI techniques for fabricating digital circuits. Through the use of LSI techniques, the circuit elements needed to implement the present invention can be fabricated at a very low cost.

I claim:
1. A signal processing system comprising:
   servo means for controlling a physical system, said servo means including feedback means for generating a feedback signal wherein said feedback signal is related to control of said physical system and
   processor means for generating an output signal related to a frequency of the feedback signal, said processor means including
   a. detector means for generating a detector signal in response to a repetitive condition of the feedback signal;
   b. reference means for generating a reference signal in response to the detector signal; and
   c. output means for generating the output signal in response to the feedback signal and the reference signal.
2. The system as set forth in claim 1 above wherein said servo means includes;
   a. command means for generating a command signal,
   b. comparing means for generating a difference signal in response to the command signal and the feedback signal wherein the difference signal is related to a difference between the command signal and the feedback signal,
   c. compensation means for generating a control signal in response to the difference signal and the output signal, and
   d. controlling means for controlling said physical system in response to the control signal.
3. The system as set forth in claim 1 above wherein said output means includes;
   a. comparing means for generating a comparison signal in response to a period of the reference signal and a period of the feedback signal, and
   b. means for generating the output signal in response to the comparison signal.
4. The system as set forth in claim 1 above further comprising:
   command means for generating a command signal; wherein said servo means includes means for controlling said physical system in response to the command signal and the feedback signal; and
   compensation means for controlling dynamics of said servo means in response to the output signal.
5. A control system comprising:
   feedback means for generating a feedback signal, said feedback signal having a phase that is related to a controlled condition;
   command means for generating a command signal, said command signal having a phase that is related to a command condition;
   comparing means for generating a phase difference signal in response to the phase of the feedback signal and the phase of the command signal;
   reference means for generating a reference signal;
   compensation means for generating a compensation signal in response to the reference signal and the feedback signal;
   combining means for generating a control signal in response to the phase difference signal and the compensation signal; and
   means for controlling the controlled condition in response to the control signal.
6. The system as set forth in claim 5 above wherein said compensation means includes means for generat- ing a frequency difference signal in response to the reference signal and the feedback signal and means for generating the compensation signal in response to the frequency difference signal.

7. The system as set forth in claim 5 above wherein said reference means includes a counter for generating the reference signal and synchronization means for synchronizing said counter with the feedback signal.

8. The system as set forth in claim 5 above wherein the reference signal has a reference time period related to a reference frequency, wherein the feedback signal has a feedback time period related to frequency of the feedback signal, wherein said reference means includes synchronization means for synchronization of the reference time period with a related feedback time period, and wherein said compensation means includes comparing means for generating a frequency difference signal in response to the reference time period and the related feedback time period and further includes means for generating the compensation signal in response to the frequency difference signal.

9. A signal processing system comprising:
clock means for generating clock pulses;
counter means for counting the clock pulses in response to an enable signal;
enable means for generating the enable signal in response to a first state of said counter means;
input means for generating an input signal; and
means for initializing said counter means to the first state in response to the input signal.

10. The system as set forth in claim 9 above wherein said counter means provides a counting operation in response to the clock pulses and wherein said initializing means includes means for synchronizing the counting operation to the input signal.

11. The system as set forth in claim 1 above wherein said feedback means is an electromagnetic sensor and wherein the output signal is related to velocity of said feedback means.

12. The system as set forth in claim 1 above further comprising compensation means for providing servo compensation in response to the output signal.

13. The system as set forth in claim 9 above further comprising output means for generating a period difference signal in response to a difference in a period of the input signal and a period of a counter state.

14. The system as set forth in claim 9 above further comprising feedback means for generating the input signal in response to motion of a physical system and output means for generating a velocity output signal in response to a state of said counter means and in response to the input signal.

15. A control system comprising:
servo means for controlling a machine;
an electromagnetic sensor for generating a sensor signal in response to the control of said machine, wherein the sensor signal has a frequency that is related to a sensed velocity;
input means for generating an input signal in response to a condition of the sensor signal;
counter means for enabling counting of clock pulses in response to a first counter state and for disabling counting of clock pulses in response to a second counter state;
means for setting said counter means to the first counter state in response to the input signal to synchronize the start of the counting with the condition of the sensor signal;
output means for generating an output velocity signal in response to the sensor signal and the state of said counter means; and
compensation means for compensating said servo means in response to the output velocity signal.

16. A control system comprising:
means for generating a repetitive signal and
means for generating a digital number in response to the repetitive signal wherein the digital number has a magnitude that is related to a characteristic of the repetitive signal.

17. The system as set forth in claim 16 above wherein said digital number generating means includes a digital counter for generating the digital number in response to clock pulses and means for providing the clock pulses in response to the repetitive sensor signal.

18. The system as set forth in claim 16 above wherein the digital number generating means includes means for generating the digital number in response to a velocity related characteristic of the repetitive sensor signal.

19. The system as set forth in claim 16 above wherein said digital number generating means includes means for generating an input signal in response to a characteristic of the repetitive sensor signal, means for generating a digital count in response to the input signal, and means for generating an output signal in response to the digital count.

* * * * *